United States Patent
Hase

(10) Patent No.: US 10,135,403 B2
(45) Date of Patent: *Nov. 20, 2018

(54) POWER AMPLIFICATION MODULE

(71) Applicant: MURATA MANUFACTURING CO., LTD., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 15 days.

This patent is subject to a terminal disclaimer.

(21) Appl. No.: 15/372,510

(22) Filed: Dec. 8, 2016

(65) Prior Publication Data

US 2017/0093345 A1   Mar. 30, 2017

Related U.S. Application Data

(63) Continuation of application No. 15/184,035, filed on Jun. 16, 2016, now Pat. No. 9,548,711.

(30) Foreign Application Priority Data

Jul. 15, 2015  (JP) .................................. 2015-141429

(51) Int. Cl.
  *G06G 7/12* (2006.01)
  *H03F 1/30* (2006.01)
  (Continued)

(52) U.S. Cl.
  CPC ............. *H03F 1/302* (2013.01); *H01L 23/66* (2013.01); *H01L 29/0804* (2013.01);
  (Continued)

(58) Field of Classification Search
  None
  See application file for complete search history.

(56) References Cited

U.S. PATENT DOCUMENTS 6,052,032 A * 4/2000 Jarvinen ................. H03F 1/302
                                                    330/289
7,439,808 B2 * 10/2008 Inamori .................... H03F 1/30
                                                    330/289
(Continued)

FOREIGN PATENT DOCUMENTS

JP   H11-330866 A   11/1999
JP   2004-236173 A   8/2004
(Continued)

*Primary Examiner* — Long Nguyen
(74) *Attorney, Agent, or Firm* — Pearne & Gordon LLP

(57) ABSTRACT

A power amplification module includes: a first bipolar transistor in which a radio frequency signal is input to a base and an amplified signal is output from a collector; a second bipolar transistor that is thermally coupled with the first bipolar transistor and that imitates operation of the first bipolar transistor; a third bipolar transistor in which a first control voltage is supplied to a base and a first bias current is output from an emitter; a first resistor that generates a third control voltage corresponding to a collector current of the second bipolar transistor at a second terminal; and a fourth bipolar transistor in which a power supply voltage is supplied to a collector, the third control voltage is supplied to a base, and a second bias current is output from an emitter.

20 Claims, 8 Drawing Sheets

(51) Int. Cl.
*H03G 3/30* (2006.01)
*H01L 23/66* (2006.01)
*H01L 29/08* (2006.01)
*H01L 29/737* (2006.01)
*H03F 3/19* (2006.01)
*H03F 3/24* (2006.01)
*H03F 3/195* (2006.01)
*H03F 3/191* (2006.01)
*H04W 88/02* (2009.01)
*H04B 1/04* (2006.01)

(52) U.S. Cl.
CPC ............. *H01L 29/737* (2013.01); *H03F 3/19* (2013.01); *H03F 3/191* (2013.01); *H03F 3/195* (2013.01); *H03F 3/24* (2013.01); *H03F 3/245* (2013.01); *H03G 3/3042* (2013.01); *H03F 2200/18* (2013.01); *H03F 2200/447* (2013.01); *H03F 2200/451* (2013.01); *H03F 2200/555* (2013.01); *H04B 2001/0408* (2013.01); *H04W 88/02* (2013.01)

(56) References Cited

U.S. PATENT DOCUMENTS

| | | | |
|---|---|---|---|
| 9,548,711 B1 * | 1/2017 | Hase | H03G 3/3042 |
| 2004/0150479 A1 | 8/2004 | Abe | |
| 2005/0077964 A1 | 4/2005 | Maeda | |
| 2006/0284684 A1 | 12/2006 | Baree | |
| 2007/0222520 A1 * | 9/2007 | Inamori | H03F 1/30 330/289 |
| 2013/0321086 A1 * | 12/2013 | Iizuka | H03F 3/19 330/296 |

FOREIGN PATENT DOCUMENTS

| JP | 2005-143079 A | 6/2005 |
|---|---|---|
| JP | 2008-547265 A | 12/2008 |

* cited by examiner

POWER AMPLIFICATION MODULE

This is a continuation of U.S. patent application Ser. No. 15/184,035 filed on Jun. 16, 2016 which claims priority from Japanese Patent Application No. 2015-141429 filed on Jul. 15, 2015. The contents of these applications are incorporated herein by reference in their entireties.

BACKGROUND

The present disclosure relates to a power amplification module.

The second generation mobile communication system (2G) and the third/fourth generation mobile communication system (3G/4G) are examples of wireless communication schemes used in mobile terminals. In 2G, it is required that the power of a radio frequency (RF) signal be changed in accordance with the waveform characteristics, which are stipulated by the standard, at the time of a burst operation in which data is continuously transmitted from a mobile terminal. In addition, a power amplification module, which is for amplifying the power of an RF signal, is used in a mobile terminal in order to transmit the RF signal to a base station. Therefore, it is required that gain variations be suppressed in the power amplification module in order to output an RF signal in accordance with the waveform characteristics stipulated by the standard.

For example, a radio frequency amplifier that aims to suppress gain variations that occur with changes in temperature is disclosed in FIG. 3 of Japanese Unexamined Patent Application Publication No. 11-330866. This radio frequency amplifier includes a power transistor Q1 and a control transistor Qc having a size of 1/m of that of the power transistor Q1. An RF signal input to the base of the power transistor Q1 is input to the base of the control transistor Qc via a resistor Rb/m and a resistor Rb. Changes that occur in the collector current of the power transistor Q1 with changes in temperature and so forth are reflected in the collector current of the control transistor Qc. A bias current supplied to the base of the power transistor Q1 is controlled and gain variations are suppressed by controlling a differential amplifier in accordance with changes in the collector current of the control transistor Qc.

As described above, the bias current is controlled by using a differential amplifier in order to suppress gain variations that occur with changes in temperature in the configuration disclosed in Japanese Unexamined Patent Application Publication No. 11-330866. Consequently, the circuit scale is increased.

BRIEF SUMMARY

The present disclosure provides a power amplification module that can suppress gain variations that occur with changes in temperature without necessarily increasing the circuit scale.

A power amplification module according to an embodiment of the present disclosure includes: a first bipolar transistor that has a radio frequency signal input to a base thereof and that outputs from a collector thereof an amplified signal obtained by amplifying the radio frequency signal; a second bipolar transistor that is thermally coupled with the first bipolar transistor, that has the radio frequency signal input to a base thereof, and that imitates operation of the first bipolar transistor; a third bipolar transistor that has a power supply voltage supplied to a collector thereof, that has a first control voltage supplied to a base thereof and that outputs a first bias current from an emitter thereof to the bases of the first and second bipolar transistors; a first resistor that has a second control voltage supplied to a first terminal thereof, that has a second terminal thereof connected to a collector of the second bipolar transistor and that generates a third control voltage at the second terminal thereof, the third control voltage corresponding to a collector current of the second bipolar transistor; and a fourth bipolar transistor that has the power supply voltage supplied to a collector thereof, that has the third control voltage supplied to a base thereof and that outputs a second bias current from an emitter thereof to the bases of the first and second bipolar transistors.

According to the embodiment of the present disclosure, a power amplification module can be provided that can suppress gain variations that that occur with changes in temperature and that can suppress an increase in circuit scale.

Other features, elements, characteristics and advantages of the present disclosure will become more apparent from the following detailed description of embodiments of the present disclosure with reference to the attached drawings.

DETAILED DESCRIPTION

Figure 1:
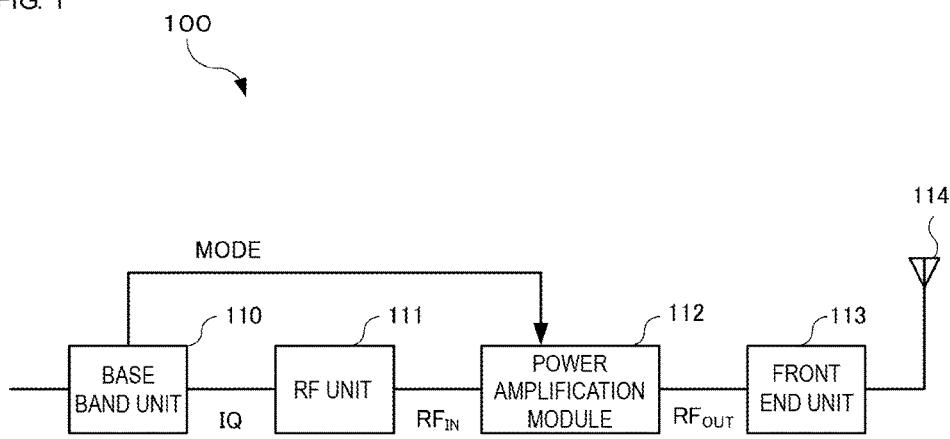
FIG. 1 illustrates an example configuration of a transmission unit that includes a power amplification module according to an embodiment of the present disclosure.

Hereafter, embodiments of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit is omitted here.

As illustrated in FIG. 1, the transmission unit 100 includes a base band unit 110, an RF unit 111, a power amplification module 112, a front end unit 113 and an antenna 114.

The base band unit 110 modulates an input signal such as speech or data and outputs a modulated signal. In this embodiment, the modulated signal output from the base band unit 110 is output as IQ signals (I signal and Q signal) with the amplitude and the phase being represented on an IQ plane. The frequencies of the IQ signals are on the order of several MHz to several tens of MHz, for example. In addition, the base band unit 110 outputs a mode signal MODE that is for controlling the gain in the power amplification module 112.

The RF unit 111 generates an RF signal ($RF_{IN}$), which is for performing wireless transmission, from the IQ signals output from the base band unit 110. The RF signal has a frequency of around several hundred MHz to several GHz, for example. In the RF unit 111, the IQ signals may be converted into an intermediate frequency (IF) signal and an RF signal may be then generated from the IF signal, instead of directly converting the IQ signals into the RF signal.

The power amplification module 112 amplifies the power of the RF signal ($RF_{IN}$) output from the RF unit 111 up to the level that is required to transmit the RF signal to the base station, and outputs an amplified signal ($RF_{OUT}$). In the power amplification module 112, the size of a bias current is determined and the gain is controlled on the basis of the mode signal MODE supplied from the base band unit 110.

The front end unit 113 performs filtering on the amplified signal ($RF_{OUT}$) and switching on a reception signal received from the base station. The amplified signal output from the front end unit 113 is transmitted to the base station via the antenna 114.

Figure 2:
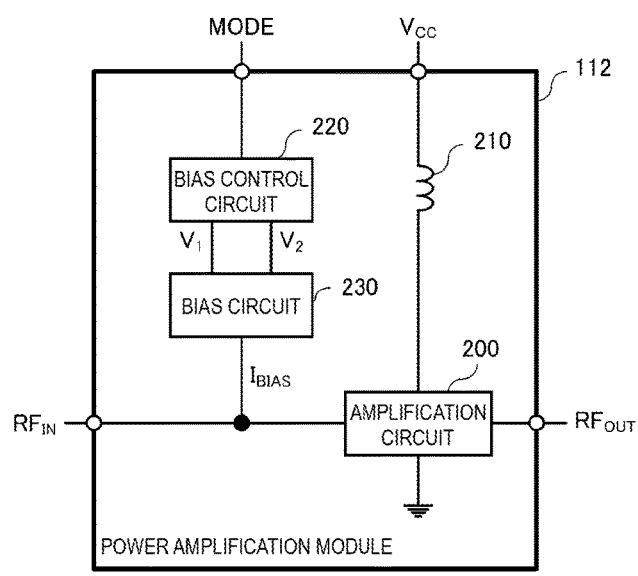
FIG. 2 illustrates an example configuration of the power amplification module.

FIG. 2 illustrates an example configuration of the power amplification module 112. As illustrated in FIG. 2, the power amplification module 112 includes an amplification circuit 200, an inductor 210, a bias control circuit 220 and a bias circuit 230.

The amplification circuit 200 amplifies the RF signal ($RF_{IN}$) and outputs an amplified signal ($RF_{OUT}$). The number of stages of the amplification circuit is not limited to one and may be two or more.

The inductor 210 is provided in order to isolate the RF signal. A power supply voltage $V_{CC}$ is supplied to the amplification circuit 200 via the inductor 210.

The bias control circuit 220 outputs control voltages $V_1$ and $V_2$, which are for controlling a bias current $I_{BIAS}$, on the basis of the mode signal MODE.

The bias circuit 230 supplies the bias current $I_{BIAS}$ to the amplification circuit 200. The size of the bias current output from the bias circuit 230 is controlled by the control voltages $V_1$ and $V_2$.

Figure 3:
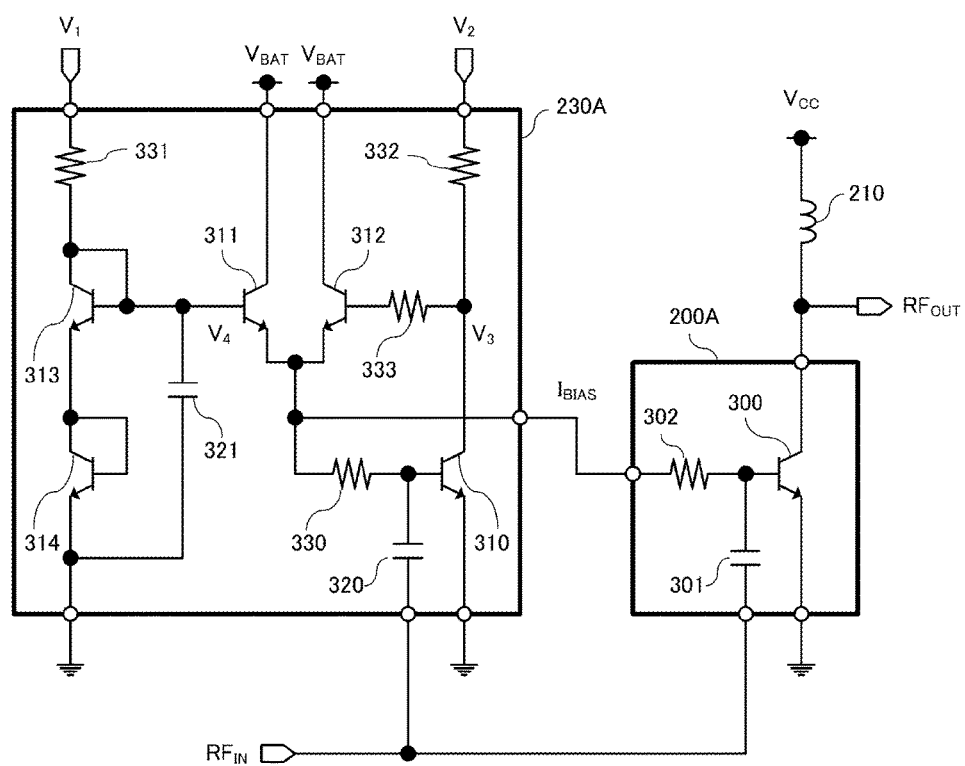
FIG. 3 illustrates configurations of an amplification circuit and a bias circuit, which are example configurations of the amplification circuit and the bias circuit illustrated in FIG. 2.

FIG. 3 illustrates configurations of an amplification circuit 200A and a bias circuit 230A, which are example configurations of the amplification circuit 200 and the bias circuit 230 illustrated in FIG. 2.

The amplification circuit 200A includes a bipolar transistor 300, a capacitor 301 and a resistor 302. The bipolar transistor 300 (first bipolar transistor) is a heterojunction bipolar transistor (HBT), for example. The RF signal ($RF_{IN}$) is input to the base of the bipolar transistor 300 via the capacitor 301. The power supply voltage $V_{CC}$ is supplied to the collector of the bipolar transistor 300 via the inductor 210. The emitter of the bipolar transistor 300 is grounded. In addition, the bias current is supplied to the base of the bipolar transistor 300 via the resistor 302 (second resistor). The amplified signal ($RF_{OUT}$) is output from the collector of the bipolar transistor 300.

The bias circuit 230A includes bipolar transistors 310, 311, 312, 313 and 314, capacitors 320 and 321 and resistors 330, 331, 332 and 333. The bipolar transistors 310 to 314 are HBTs, for example.

The bipolar transistor 310 (second bipolar transistor) is a transistor that imitates operation of the bipolar transistor 300. The RF signal ($RF_{IN}$) is input to the base of the bipolar transistor 310 via the capacitor 320. The collector of the bipolar transistor 310 is connected to the resistor 332. The emitter of the bipolar transistor 310 is grounded. In addition, the bias current is supplied to the base of the bipolar transistor 310 via the resistor 330 (third resistor). An amplified signal obtained by amplifying the RF signal ($RF_{IN}$) is output from the collector of the bipolar transistor 310. In other words, the collector current of the bipolar transistor 310 is at a level that corresponds to the RF signal ($RF_{IN}$).

The emitter area of the bipolar transistor 310 may be smaller than the emitter area of the bipolar transistor 300. Consumption of current in the bias circuit 230A can be reduced by making the emitter area of the bipolar transistor 310 smaller.

The control voltage $V_2$ (second control voltage) is supplied to a first terminal of the resistor 332 (first resistor) and a second terminal of the resistor 332 is connected to the collector of the bipolar transistor 310. The collector current of the bipolar transistor 310 flows to the resistor 332. Thus, a control voltage $V_3$ (third control voltage) that corresponds to the collector current of the bipolar transistor 310 is generated at the second terminal of the resistor 332.

The bipolar transistor 311 (third bipolar transistor) is a transistor for generating a bias current (first bias current) to be supplied to the bipolar transistors 300 and 310. A power supply voltage (for example, battery voltage $V_{BAT}$) is supplied to the collector of the bipolar transistor 311. The base of the bipolar transistor 311 is connected to the base of the bipolar transistor 313. A control voltage $V_4$ (first control voltage), which is for controlling the bias current, is supplied to the base of the bipolar transistor 311. The emitter of the bipolar transistor 311 is connected to the resistors 302 and 330. A bias current (first bias current) that corresponds to the control voltage $V_4$ is output from the emitter of the bipolar transistor 311.

The bipolar transistor 312 (fourth bipolar transistor) is a transistor for generating a bias current (second bias current) to be supplied to the bipolar transistors 300 and 310. A power supply voltage (for example, battery voltage $V_{BAT}$) is supplied to the collector of the bipolar transistor 312. The base of the bipolar transistor 312 is connected to a first terminal of the resistor 333. A second terminal of the resistor 333 is connected to the second terminal of the resistor 332. Therefore, the control voltage $V_3$ (third control voltage) (actually, a voltage that is lower than the control voltage $V_3$ by an amount corresponding to the base current of bipolar transistor 312) is supplied to the base of the bipolar transistor 312 via the resistor 333. The emitter of the bipolar transistor 312 is connected to the resistors 302 and 330. A bias current (second bias current) that corresponds to the control voltage $V_3$ is output from the emitter of the bipolar transistor 312.

The control voltage $V_1$ (fourth control voltage) is supplied to a first terminal of the resistor 331 (fifth resistor) and a second terminal of the resistor 331 is connected to the collector of the bipolar transistor 313.

The base and the collector of the bipolar transistor 313 (fifth bipolar transistor) are connected to each other, the base of the bipolar transistor 313 is connected to the base of the bipolar transistor 311, and the emitter of the bipolar transistor 313 is connected to the collector of the bipolar transistor 314 (sixth bipolar transistor). The base and the collector of the bipolar transistor 314 are connected to each other and the emitter of the bipolar transistor 314 is grounded. The control voltage $V_4$ corresponding to the control voltage $V_1$ is output from the base of the bipolar transistor 313.

A first terminal of the capacitor 321 is connected to the base of the bipolar transistor 313 and a second terminal of the capacitor 321 is grounded.

The bipolar transistors 300, 310 and 314 are thermally coupled with each other in the amplification circuit 200A and the bias circuit 230A. In other words, the bipolar transistors 300, 310 and 314 are arranged close to each other on an integrated circuit such that when the temperature of one transistor varies, the temperatures of the other transistors also vary.

Operation of the amplification circuit 200A and the bias circuit 230A will be described next.

The gain of the amplification circuit 200A changes when the temperature of the bipolar transistor 300 changes due to the operation of the bipolar transistor 300. Specifically, when the temperature changes, the common-emitter current amplification factor (hereafter, simply "current amplification factor") β and the base-emitter voltage $V_{BE}$ change. The current amplification factor β and the base-emitter voltage $V_{BE}$ both decrease as the temperature increases. Assuming that the base voltage and the collector voltage of the bipolar transistor 300 are constant, a decrease in the current amplification factor β causes an idling current to decrease. In addition, a decrease in the base-emitter voltage $V_{BE}$ causes the idling current to increase. Here, the current amplification factor β and the base-emitter voltage $V_{BE}$ contribute different amounts to the idling current and therefore the gain of the amplification circuit 200A varies with changes in the current amplification factor β and the base-emitter voltage $V_{BE}$.

For example, if it is assumed that the bias current $I_{BIAS}$ is constant, the gain of the amplification circuit 200A decreases when the current amplification factor β of the bipolar transistor 300 decreases due to an increase in temperature. At this time, since the bipolar transistor 310 imitates the operation of the bipolar transistor 300, the bipolar transistor 310 undergoes a similar change in temperature to the bipolar transistor 300. Therefore, the current amplification factor β of the bipolar transistor 310 decreases and the control voltage $V_3$ increases. When the control voltage $V_3$ increases, the bias current output from the emitter of the bipolar transistor 312 increases. Thus, the bias current $I_{BIAS}$ supplied to the bipolar transistor 300 increases and a decrease in the gain of the amplification circuit 200A is suppressed.

Since the bipolar transistors 300 and 310 are thermally coupled with each other in the amplification circuit 200A and the bias circuit 230A, changes in the current amplification factor β that occur with changes in temperature can be more accurately connected to each other.

Furthermore, for example, if it assumed that the bias current is constant, the gain of the amplification circuit 200A increases when the base-emitter voltage $V_{BE}$ of the bipolar transistor 300 decreases due to an increase in temperature. The bipolar transistors 300 and 314 are thermally coupled with each other in the amplification circuit 200A and the bias circuit 230A. Therefore, the bipolar transistor 314 undergoes a similar change in temperature to the bipolar transistor 300. Therefore, the base-emitter voltage $V_{BE}$ of the bipolar transistor 314 decreases and the control voltage $V_4$ decreases. When the control voltage $V_4$ decreases, the bias current output from the emitter of the bipolar transistor 311 decreases. Thus, the bias current $I_{BIAS}$ supplied to the bipolar transistor 300 decreases and an increase in the gain of the amplification circuit 200A is suppressed.

Thus, variations in gain caused by changes in the temperature of the bipolar transistor 300 can be suppressed in the amplification circuit 200A and the bias circuit 230A. In addition, by configuring the bias circuit 230A to control the bias current, an increase in circuit scale is reduced compared with the case where a differential amplifier is used.

Furthermore, in the amplification circuit 200A, the RF signal ($RF_{IN}$) is supplied to a point between the resistor 302 and the base of the bipolar transistor 300 via the capacitor 301. Similarly, in the bias circuit 230A, the RF signal ($RF_{IN}$) is supplied to a point between the resistor 330 and the base of the bipolar transistor 310 via the capacitor 320. Thus, the path along which the RF signal ($RF_{IN}$) is supplied to the bipolar transistor 310 is the same as the path along which the RF signal ($RF_{IN}$) is supplied to the bipolar transistor 300. For example, if there were a resistor on the path along which the RF signal ($RF_{IN}$) is supplied to the bipolar transistor 310, an alternating-current component of the RF signal ($RF_{IN}$) would be attenuated and the accuracy with which the bipolar transistor 310 imitates the bipolar transistor 300 would decrease. In the configuration illustrated in FIG. 3, the RF signal ($RF_{IN}$) is supplied along the same path to the bipolar transistors 300 and 310 and therefore a decrease in the imitation accuracy of the bipolar transistor 310 can be prevented. Thus, the effect of suppressing variations in gain that occur with changes in temperature is improved.

Figure 4:
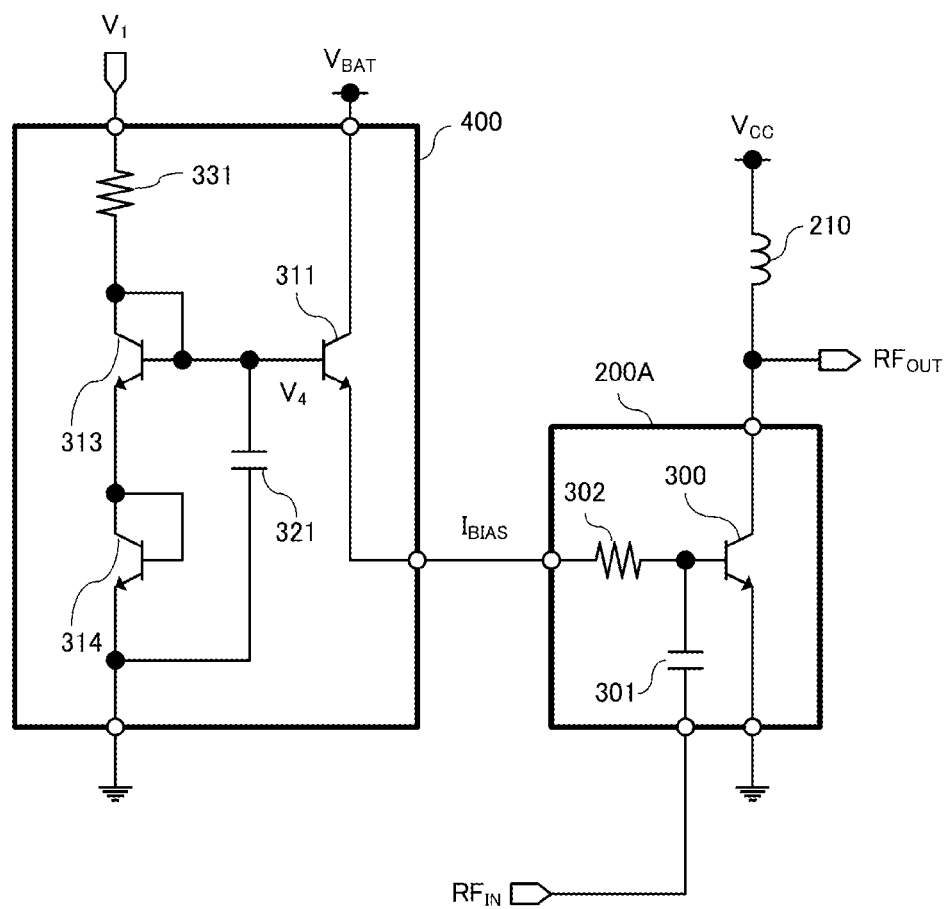
FIG. 4 illustrates the configuration of a comparative example, which is for comparison with the embodiment.

The suppression of variations in gain that occur with changes in the current amplification factor β in the amplification circuit 200A and the bias circuit 230A of this embodiment will be described by using simulation results. FIG. 4 illustrates the configuration of a comparative example, which is for comparison with this embodiment. The comparative example includes the amplification circuit 200A and a bias circuit 400. Elements that are the same as those illustrated in FIG. 3 are denoted by the same symbols and description thereof is omitted.

As illustrated in FIG. 4, the bias circuit 400 includes the bipolar transistors 311, 313 and 314, a capacitor 321 and a resistor 331. The bias circuit 400 does not include the bipolar transistors 310 and 312, the capacitor 320 and the resistors 330, 332 and 333 of the bias circuit 230A. In other words, the bias circuit 400 does not include a part that suppresses gain variations of the amplification circuit 200A caused by changes in the current amplification factor β that occur with changes in the temperature of the bipolar transistor 300. In addition, the bipolar transistors 300 and 314 are thermally coupled with each other.

Figure 5:
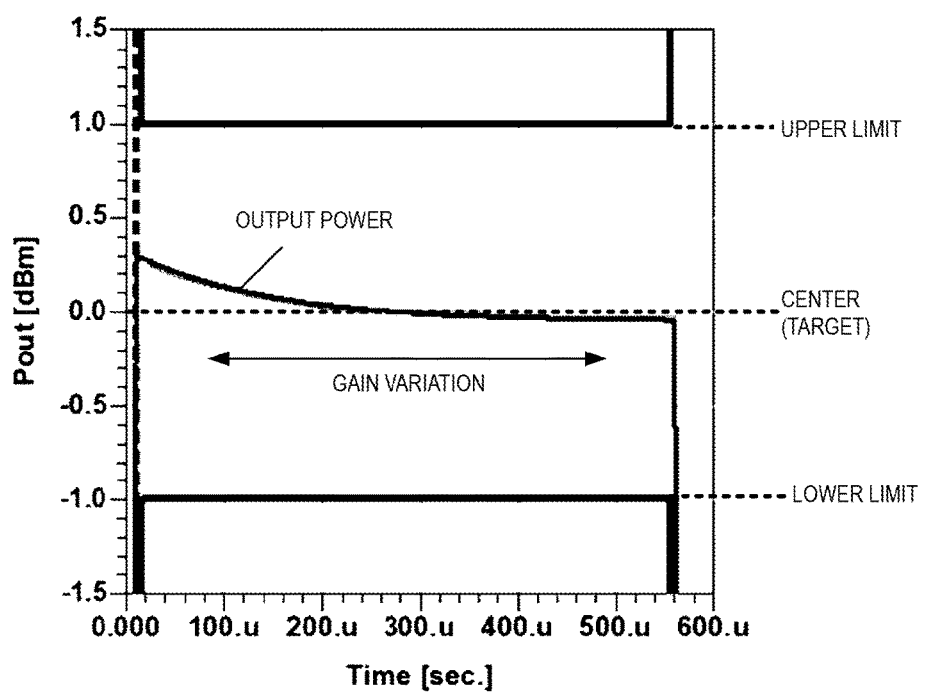
FIG. 5 illustrates simulation results for the comparative example illustrated in FIG. 4.

FIG. 5 illustrates simulation results for the comparative example illustrated in FIG. 4. In FIG. 5, the horizontal axis represents time (seconds) and the vertical axis represents output power (dBm). The vertical axis is normalized such that a target level of the output power is zero. A target level, an upper limit and a lower limit of the output power are illustrated in FIG. 5. FIG. 5 illustrates results obtained by outputting a pulse signal such that the output power comes to be at the target level. In the results illustrated in FIG. 5, in particular, the gain varies in a period of around 200 microseconds after the start of operation.

Figure 6:
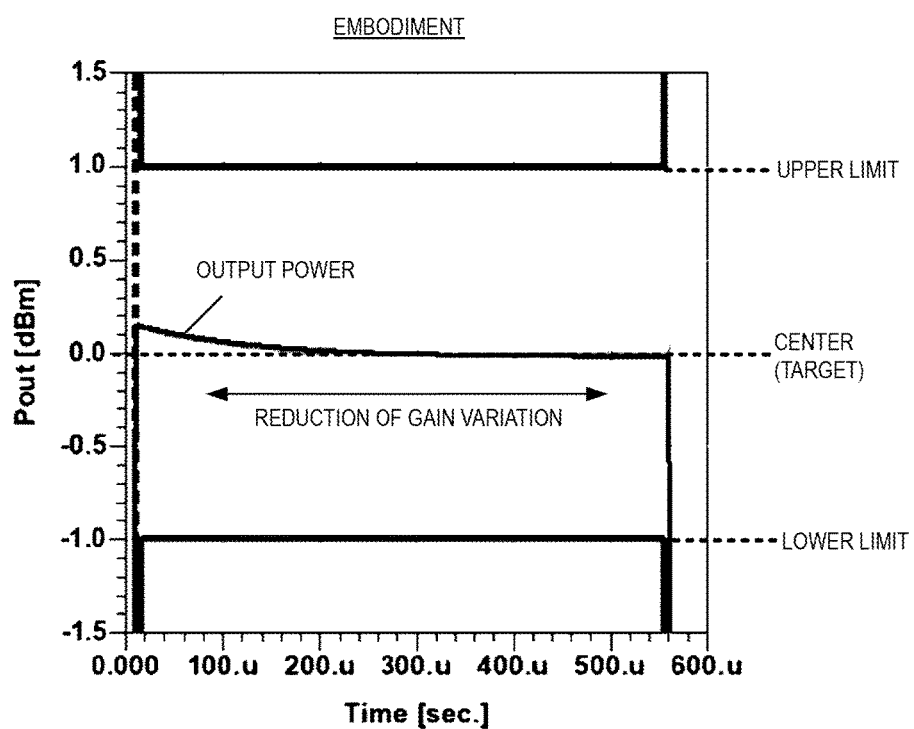
FIG. 6 illustrates simulation results for the amplification circuit and the bias circuit of the embodiment.

FIG. 6 illustrates simulation results for the amplification circuit 200A and the bias circuit 230A of this embodiment. The horizontal axis and the vertical axis represent the same variables as in FIG. 5. FIG. 6 illustrates results obtained by outputting a pulse signal such that the output power comes to be at the target level, similarly to as in FIG. 5. In the results illustrated in FIG. 6, in particular, it is clear that the size of the variation in gain is reduced in the period of around 200 microseconds after the start of operation when compared with the results illustrated in FIG. 5. Thus, it is also clear from these simulation results that the variations in gain that occur with changes in the current amplification factor β are suppressed in the amplification circuit 200A and the bias circuit 230A of this embodiment.

Figure 7:
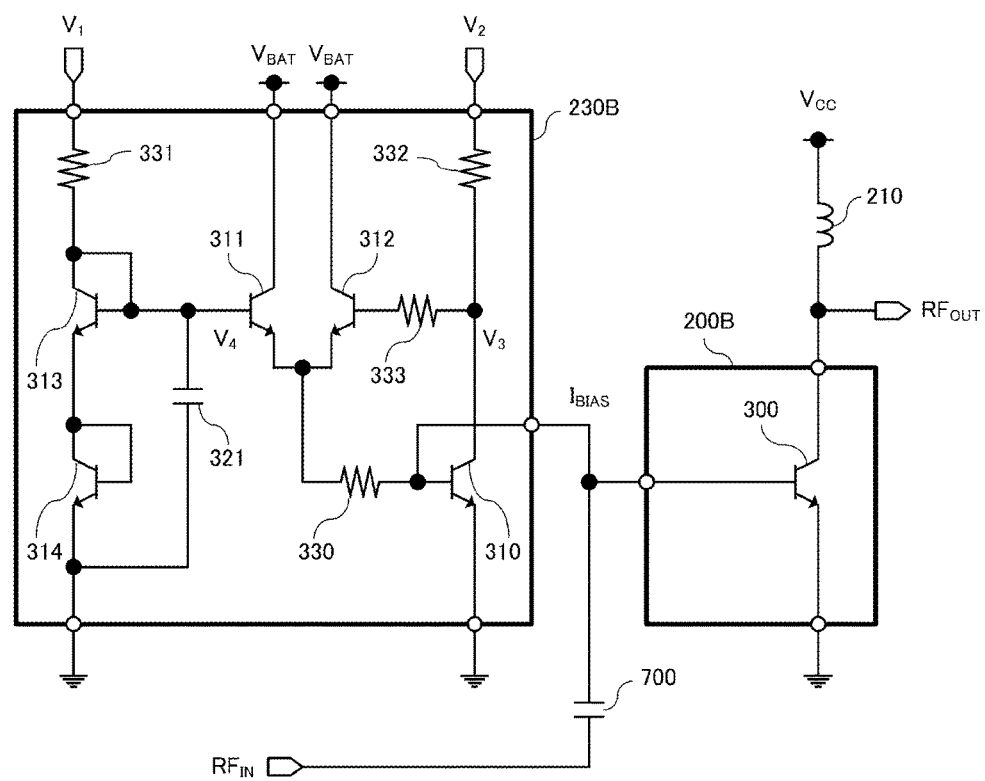
FIG. 7 illustrates configurations of an amplification circuit and a bias circuit, which are example configurations of the amplification circuit and the bias circuit illustrated in FIG. 2.

FIG. 7 illustrates the configurations of an amplification circuit 200B and a bias circuit 230B, which are example configurations of the amplification circuit 200 and the bias circuit 230. Elements that are the same as those of the amplification circuit 200A and the bias circuit 230A illustrated in FIG. 3 are denoted by the same symbols and description thereof is omitted.

The amplification circuit 200B does not include the capacitor 301 and the resistor 302 of the amplification circuit 200A illustrated in FIG. 3. The bias circuit 230B does not include the capacitor 320 of the bias circuit 230A illustrated in FIG. 3. The RF signal ($RF_{IN}$) is input to the bases of the bipolar transistors 300 and 310 via a capacitor 700. In addition, a first terminal of the resistor 330 (fourth resistor) is connected to the emitters of the bipolar transistors 311 and 312 and a second terminal of the resistor 330 is connected to the bases of the bipolar transistors 300 and 310. In other words, in the configuration illustrated in FIG. 7, the capacitor 700 and the resistor 330 are shared by the amplification circuit 200B and the bias circuit 230B. With this configuration as well, the same effect as with the configuration illustrated in FIG. 3 can be attained. Furthermore, the circuit scale of the power amplification module 112 can be reduced as result of the capacitor 700 and the resistor 330 being shared.

Figure 8:
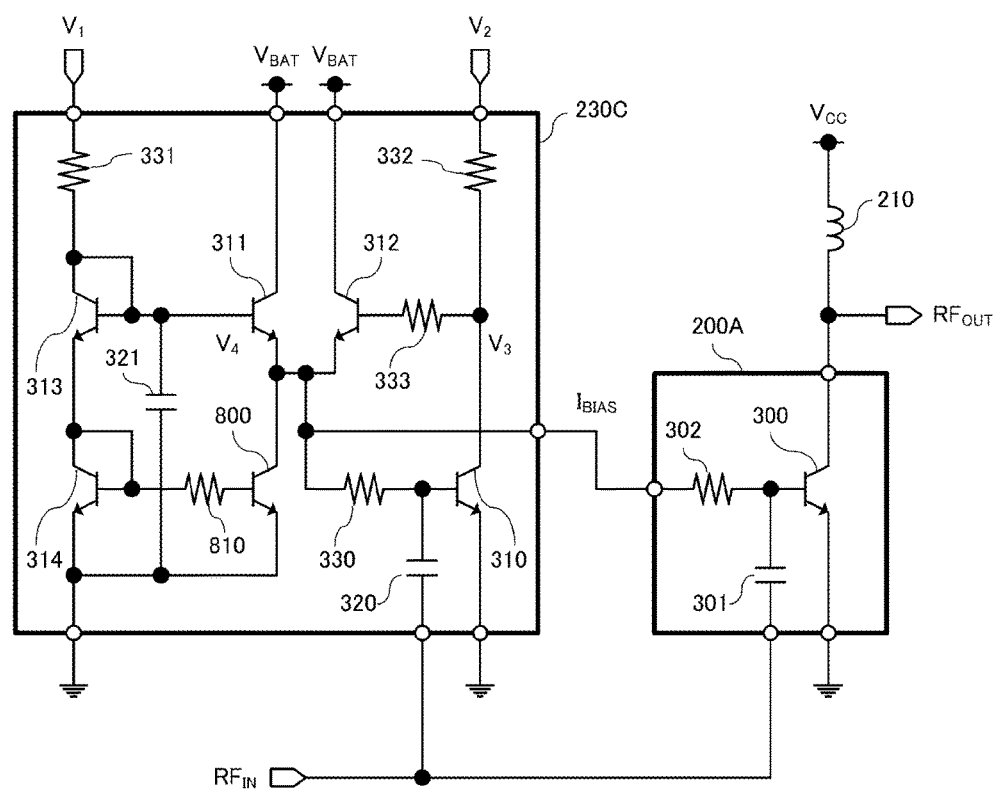
FIG. 8 illustrates configurations of an amplification circuit and a bias circuit, which are example configurations of the amplification circuit and the bias circuit illustrated in FIG. 2.

FIG. 8 illustrates the configurations of the amplification circuit 200A and a bias circuit 230C, which are example configurations of the amplification circuit 200 and the bias circuit 230. Elements that are the same as those of the amplification circuit 200A and the bias circuit 230A illustrated in FIG. 3 are denoted by the same symbols and description thereof is omitted.

The bias circuit 230C includes a bipolar transistor 800 and a resistor 810 in addition to the elements included in the bias circuit 230A illustrated in FIG. 3. The bipolar transistor 800 is an HBT, for example. The collector of the bipolar transistor 800 (seventh bipolar transistor) is connected to the emitters of the bipolar transistors 311 and 312, the base of the bipolar transistor 800 is connected to the base of the bipolar transistor 314 via the resistor 810 (sixth resistor) and the emitter of the bipolar transistor 800 is grounded. The bipolar transistor 800 is thermally coupled with the bipolar transistor 300.

With the configuration illustrated in FIG. 8, degradation of the linearity of the power amplification module 112 can be suppressed by providing the bipolar transistor 800 in the bias circuit 230C. This will be explained below.

In the bias circuit 230C, a bias current is output from the emitters of the bipolar transistors 311 and 312. Here, the bias current exhibits amplitude variations due to the effect of the RF signal ($RF_{IN}$). When the level of the RF signal ($RF_{IN}$) becomes large, the amplitude of the bias current also becomes large. When the amplitude of the bias current becomes large, a negative current (current in direction from resistors 302 and 330 toward emitters of bipolar transistors 311 and 312) is generated.

The negative current might be cut by the rectification action of the base-emitter PN junctions of the bipolar transistors 311 and 312 in the case of a configuration that does not include the bipolar transistor 800 (in other words, bias circuit 230A illustrated in FIG. 3). When the negative current is cut, the average bias current increases and the gain of the amplification circuit 200A becomes larger. The increase in the gain of the amplification circuit 200A leads to a decrease in the linearity of the power amplification module 112.

In the bias circuit 230C, the negative current flows to ground via the bipolar transistor 800. Therefore, since the negative part of the bias current is not cut in the bias circuit 230C, an increase in the average bias current in the case where the level of the RF signal ($RF_{IN}$) becomes large can be suppressed. Thus, degradation of the linearity of the gain in the power amplification module 112 can be suppressed.

Thus, in addition to achieving the same effect as with the configuration illustrated in FIG. 3, degradation of the linearity of the gain in the power amplification module 112 can be suppressed with the configuration illustrated in FIG. 8.

Furthermore, the resistor 810 is provided between the base of the bipolar transistor 314 and the base of the bipolar transistor 800 in the configuration illustrated in FIG. 8. As a result, the size of the current that flows to the bipolar transistor 800 can be adjusted.

In addition, the bipolar transistor 800 is thermally coupled with the bipolar transistor 300 in the configuration illustrated in FIG. 8. As a result, the size of the current that flows to the bipolar transistor 800 is adjusted with changes in the temperature of the bipolar transistor 800.

A configuration similar to that illustrated in FIG. 8 can be adopted for the configuration illustrated in FIG. 7 as well.

Figure 9:
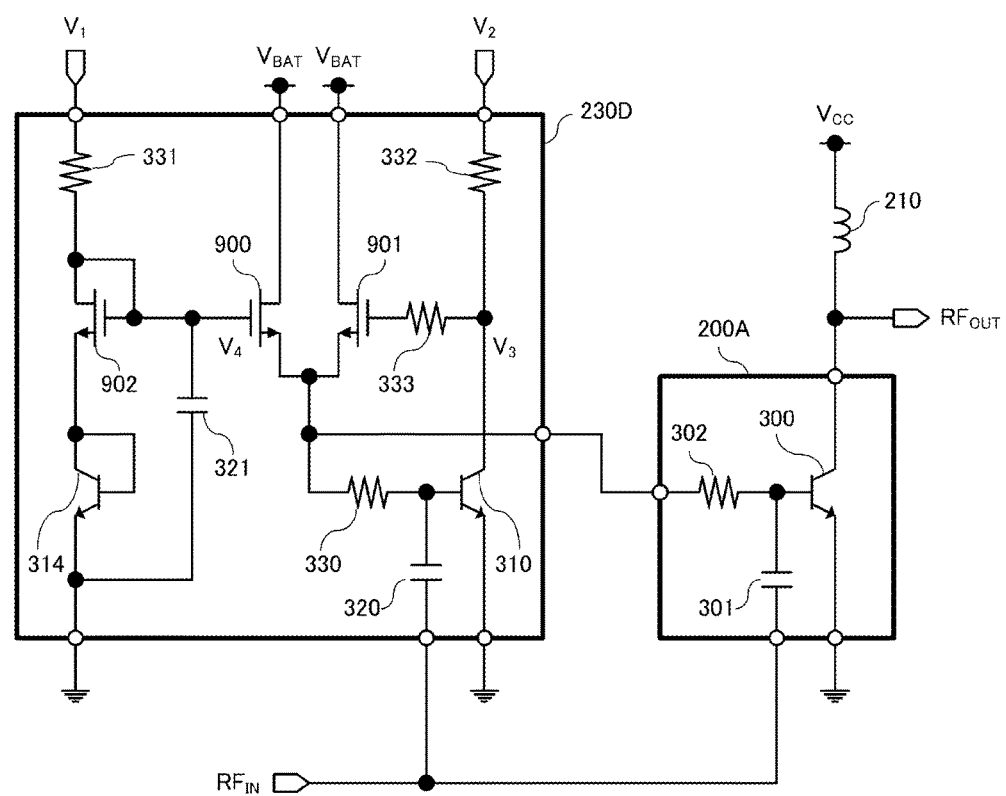
FIG. 9 illustrates configurations of an amplification circuit and a bias circuit, which are example configurations of the amplification circuit and the bias circuit illustrated in FIG. 2.

FIG. 9 illustrates configurations of the amplification circuit 200A and a bias circuit 230D, which are example configurations of the amplification circuit 200 and the bias circuit 230. Elements that are the same as those of the amplification circuit 200A and the bias circuit 230A illustrated in FIG. 3 are denoted by the same symbols and description thereof is omitted.

The bias circuit 230D includes field effect transistors (FETs) 900, 901 and 902 instead of the bipolar transistors 311, 312 and 313 of the bias circuit 230A.

The battery voltage $V_{BAT}$ is supplied to the drain of the FET 900 (first field effect transistor). The gate of the FET 900 is connected to the gate of the FET 902. The control voltage $V_4$ is supplied to the gate of the FET 900. The source of the FET 900 is connected to the resistors 302 and 330.

The battery voltage $V_{BAT}$ is supplied to the drain of the FET 901 (second field effect transistor). The gate of the FET 901 is connected to the first terminal of the resistor 333. The second terminal of the resistor 333 is connected to the second terminal of the resistor 332. Therefore, the control voltage $V_3$ (actually, a voltage that is lower than the control voltage $V_3$ by an amount corresponding to the gate current of the FET 901) is supplied to the gate of the FET 901 via the resistor 333. The source of the FET 901 is connected to the resistors 302 and 330.

The drain of the FET 902 (third field effect transistor) is connected to the second terminal of the resistor 331. The gate and the drain of the FET 902 are connected to each other, the gate of the FET 902 is connected to the gate of the FET 900 and the source of the FET 902 is connected to the collector of the bipolar transistor 314. The control voltage $V_4$ corresponding to the control voltage $V_1$ is output from the gate of the FET 902.

In the bias circuit 230D, the FETs 900, 901 and 902 operate in the same ways as the bipolar transistors 311, 312 and 313 of the bias circuit 230A. Thus, the same effect can be achieved with the bias circuit 230D as with the bias circuit 230A. In addition, in the bias circuit 230D, as a result of using the FETs 900, 901 and 902, lower voltage operation is possible compared with the case where the bipolar transistors 311, 312 and 313 are used.

The FETs 900, 901 and 902 may be provided instead of the bipolar transistors 311, 312 and 313 in the bias circuit 230B illustrated in FIG. 7 and the bias circuit 230C illustrated in FIG. 8 as well.

Exemplary embodiments of the present disclosure have been described above. In the configuration illustrated in FIG. 3, the bias current output from the bipolar transistor 312 is controlled in accordance with the collector current of the bipolar transistor 310 that imitates the operation of the bipolar transistor 300. Thus, variations in gain caused by changes in the temperature of the bipolar transistor 300 can be suppressed. Furthermore, since a differential amplifier is not needed as a part for controlling the bias current in the bias circuit 230A, an increase in circuit scale can be suppressed. The same is true for the configurations illustrated in FIGS. 7 to 9 as well.

In addition, in the configuration illustrated in FIG. 3, since the bipolar transistors 300 and 310 are thermally coupled with each other, the accuracy with which the bipolar transistor 310 imitates the operation of the bipolar transistor 300 is improved and the effect of suppressing variations in gain caused by changes in the temperature of the bipolar transistor 300 is improved. The same is true for the configurations illustrated in FIGS. 7 to 9 as well.

Furthermore, in the configuration illustrated in FIG. 3, the emitter area of the bipolar transistor 310 that imitates the operation of the bipolar transistor 300 is smaller than the emitter area of the bipolar transistor 300. Therefore, the current consumption can be reduced. The same is true for the configurations illustrated in FIGS. 7 to 9 as well.

In addition, in the configuration illustrated in FIG. 3, the path along which the RF signal ($RF_{IN}$) is supplied to the bipolar transistor 310 is the same as the path along which the RF signal ($RF_{IN}$) is supplied to the bipolar transistor 300. Thus, a reduction in the imitation accuracy of the bipolar transistor 310 is prevented and the effect of suppressing variations in gain caused by changes in temperature is improved. The same is true for the configurations illustrated in FIGS. 7 to 9 as well.

In addition, the bipolar transistor 314 is thermally coupled with the bipolar transistor 300 in the configuration illustrated in FIG. 3. Therefore, the base-emitter voltage $V_{BE}$ of the bipolar transistor 314 changes with the base-emitter voltage $V_{BE}$ of the bipolar transistor 300. The control voltage $V_4$ supplied to the base of the bipolar transistor 311 changes in conjunction with changes in the base-emitter voltage $V_{BE}$ of the bipolar transistor 314, and consequently the bias current output from the bipolar transistor 311 changes. Thus, variations in gain caused by changes in the temperature of the bipolar transistor 300 can be suppressed. The same is true for the configurations illustrated in FIGS. 7 to 9 as well.

Furthermore, in the configuration illustrated in FIG. 8, a negative current generated when the level of the RF signal ($RF_{IN}$) becomes large (current in direction from resistors 302 and 330 toward emitters of bipolar transistor 311 and 312) flows to ground via the bipolar transistor 800. Therefore, an increase in the average bias current is suppressed and degradation of the linearity of the gain in the power amplification module 112 can be suppressed.

In addition, the resistor 810 is provided between the base of the bipolar transistor 314 and the base of the bipolar transistor 800 in the configuration illustrated in FIG. 8. As a result, the size of the current that flows to the bipolar transistor 800 can be adjusted.

Furthermore, the bipolar transistor 800 is thermally coupled with the bipolar transistor 300 in the configuration illustrated in FIG. 8. As a result, the size of the current that flows to the bipolar transistor 800 is adjusted with changes in the temperature of the bipolar transistor 800.

In addition, in the configuration illustrated in FIG. 9, the FETs 900, 901 and 902 are provided instead of the bipolar transistors 311, 312 and 313 in the configuration illustrated in FIG. 3. Thus, lower voltage operation is possible compared with the case where the bipolar transistors 311, 312 and 313 are used.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by one skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   a first bipolar transistor, wherein when a radio frequency signal is input to a base of the first bipolar transistor, the first bipolar transistor outputs from a collector of the first bipolar transistor an amplified signal obtained by amplifying the radio frequency signal;
   a second bipolar transistor that imitates operation of the first bipolar transistor when the radio frequency signal is input to a base of the second bipolar transistor;
   a third bipolar transistor, wherein when a power supply voltage is supplied to a collector of the third bipolar transistor and a first control voltage is supplied to a base of the third bipolar transistor, the third bipolar transistor outputs a first bias current from an emitter of the third bipolar transistor to the base of the first bipolar transistor and the base of the second bipolar transistor;
   a first resistor, wherein when a second control voltage is supplied to a first terminal of the first resistor and a second terminal of the first resistor is connected to a collector of the second bipolar transistor, the first resistor generates a third control voltage at the second terminal of the first resistor, the third control voltage corresponding to a collector current of the second bipolar transistor; and
   a fourth bipolar transistor, wherein when the power supply voltage is supplied to a collector of the fourth bipolar transistor and the third control voltage is supplied to a base of the fourth bipolar transistor, the fourth bipolar transistor outputs a second bias current from an emitter of the fourth bipolar transistor to the base of the first bipolar transistor and the base of the second bipolar transistor.

2. The power amplification module according to claim 1, wherein an emitter area of the second bipolar transistor is smaller than an emitter area of the first bipolar transistor.

3. The power amplification module according to claim 1, further comprising:
a second resistor, wherein a first terminal of the second resistor is connected to the emitter of the third bipolar transistor and the emitter of the fourth bipolar transistor, and a second terminal of the second resistor is connected to the base of the first bipolar transistor; and
a third resistor, wherein a first terminal of the third resistor is connected to the emitter of the third bipolar transistor and the emitter of the fourth bipolar transistor, and a second terminal of the third resistor is connected to the base of the second bipolar transistor;
wherein the radio frequency signal is supplied to a point between the second terminal of the second resistor and the base of the first bipolar transistor and to a point between the second terminal of the third resistor and the base of the second bipolar transistor.

4. The power amplification module according to claim 1, further comprising:
a fourth resistor, wherein a first terminal of the fourth resistor is connected to the emitter of the third bipolar transistor and the emitter of the fourth bipolar transistor and a second terminal of the fourth resistor is connected to the base of the first bipolar transistor and the base of the second bipolar transistor;
wherein the radio frequency signal is supplied to a point between the second terminal of the fourth resistor and the base of the first bipolar transistor and the base of the second bipolar transistor.

5. The power amplification module according to claim 4, further comprising:
a first capacitor, wherein the radio frequency signal is input to the base of the first bipolar transistor and the base of the second bipolar transistor via the first capacitor.

6. The power amplification module according to claim 1, further comprising:
a fifth resistor;
a fifth bipolar transistor; and
a sixth bipolar transistor;
wherein a fourth control voltage is supplied to a first terminal of the fifth resistor and a second terminal of the fifth resistor is connected to a collector of the fifth bipolar transistor,
a base and the collector of the fifth bipolar transistor are connected to each other and an emitter of the fifth bipolar transistor is connected to a collector of the sixth bipolar transistor,
a base and the collector of the sixth bipolar transistor are connected to each other and an emitter of the sixth bipolar transistor is grounded, and
the first control voltage is output from the base of the fifth bipolar transistor.

7. The power amplification module according to claim 6, further comprising:
a seventh bipolar transistor, wherein a collector of the seventh bipolar transistor is connected to the emitter of the third bipolar transistor and the emitter of the fourth bipolar transistor, a base of the seventh bipolar transistor is connected to the base of the sixth bipolar transistor, and an emitter of the seventh bipolar transistor is grounded.

8. The power amplification module according to claim 7, further comprising:
a sixth resistor that is provided between the base of the sixth bipolar transistor and the base of the seventh bipolar transistor.

9. The power amplification module according to claim 7, wherein the first bipolar transistor and the seventh bipolar transistor are thermally coupled with each other.

10. A power amplification module comprising:
a first bipolar transistor, wherein when a radio frequency signal is input to a base of the first bipolar transistor, the first bipolar transistor outputs from a collector of the first bipolar transistor an amplified signal obtained by amplifying the radio frequency signal;
a second bipolar transistor that is thermally coupled with the first bipolar transistor, wherein when the radio frequency signal is input to a base of the second bipolar transistor, the second bipolar transistor imitates operation of the first bipolar transistor;
a first resistor, wherein when a second control voltage is supplied to a first terminal of the first resistor and a second terminal of the first resistor is connected to a collector of the second bipolar transistor, the first resistor generates a third control voltage at the second terminal of the first resistor, the third control voltage corresponding to a collector current of the second bipolar transistor; and
a fourth bipolar transistor, wherein when the power supply voltage is supplied to a collector of the fourth bipolar transistor and the third control voltage is supplied to a base of the fourth bipolar transistor, the fourth bipolar transistor outputs a second bias current from an emitter of the fourth bipolar transistor to the base of the first bipolar transistor and the base of the second bipolar transistor,
wherein the first, second, third and fourth bipolar transistors are heterojunction bipolar transistor.

11. The power amplification module according to claim 10, wherein an emitter area of the second bipolar transistor is smaller than an emitter area of the first bipolar transistor.

12. The power amplification module according to claim 10, further comprising:
a fifth resistor;
a fifth bipolar transistor; and
a sixth bipolar transistor;
wherein a fourth control voltage is supplied to a first terminal of the fifth resistor and a second terminal of the fifth resistor is connected to a collector of the fifth bipolar transistor,
a base and the collector of the fifth bipolar transistor are connected to each other and an emitter of the fifth bipolar transistor is connected to a collector of the sixth bipolar transistor,
a base and the collector of the sixth bipolar transistor are connected to each other and an emitter of the sixth bipolar transistor is grounded,
the first bipolar transistor and the sixth bipolar transistor are thermally coupled with each other, and
the first control voltage is output from the base of the fifth bipolar transistor.

13. The power amplification module according to claim 12, further comprising:
a seventh bipolar transistor, wherein a collector of the seventh bipolar transistor is connected to the emitter of the third bipolar transistor and the emitter of the fourth bipolar transistor, a base of the seventh bipolar transistor is connected to the base of the sixth bipolar transistor, and an emitter of the seventh bipolar transistor is grounded.

14. The power amplification module according to claim 13, further comprising:
a sixth resistor that is provided between the base of the sixth bipolar transistor and the base of the seventh bipolar transistor.

15. The power amplification module according to claim 13,
wherein the first bipolar transistor and the seventh bipolar transistor are thermally coupled with each other.

16. A power amplification module comprising:
a first bipolar transistor, wherein when a radio frequency signal is input to a base of the first bipolar transistor, the first bipolar transistor outputs from a collector of the first bipolar transistor an amplified signal obtained by amplifying the radio frequency signal;
a second bipolar transistor that imitates operation of the first bipolar transistor when the radio frequency signal is input to a base of the second bipolar transistor;
a first field effect transistor, wherein when a power supply voltage is supplied to a drain of the first field effect transistor and a first control voltage is supplied to a gate of the first field effect transistor, the first field effect transistor outputs a first bias current from a source of the first field effect transistor to the base of the first bipolar transistor and the base of the second bipolar transistor;
a first resistor, wherein when a second control voltage is supplied to a first terminal of the first resistor and a second terminal of the first resistor is connected to a collector of the second bipolar transistor, the first resistor generates a third control voltage at the second terminal of the first resistor, the third control voltage corresponding to a collector current of the second bipolar transistor; and
a second field effect transistor, wherein when the power supply voltage is supplied to a drain of the second field effect transistor and the third control voltage is supplied to a gate of the second field effect transistor, the second field effect transistor outputs a second bias current from a source of the second field effect transistor to the base of the first bipolar transistor and the base of the second bipolar transistor.

17. The power amplification module according to claim 16,
wherein an emitter area of the second bipolar transistor is smaller than an emitter area of the first bipolar transistor.

18. The power amplification module according to claim 16, further comprising:
a second resistor, wherein a first terminal of the second resistor is connected to the source of the first field effect transistor and the source of the second field effect transistor, and a second terminal of the second resistor is connected to the base of the first bipolar transistor; and
a third resistor, wherein a first terminal of the third resistor is connected to the source of the first field effect transistor and the source of the second field effect transistor, and a second terminal of the third resistor is connected to the base of the second bipolar transistor;
wherein the radio frequency signal is supplied to a point between the second terminal of the second resistor and the base of the first bipolar transistor and to a point between the second terminal of the third resistor and the base of the second bipolar transistor.

19. The power amplification module according to claim 16, further comprising:
a fourth resistor, wherein a first terminal of the fourth resistor is connected to the source of the first field effect transistor and the source of the second field effect transistor and a second terminal of the fourth resistor is connected to the base of the first bipolar transistor and the base of the second bipolar transistor;
wherein the radio frequency signal is supplied to a point between the second terminal of the fourth resistor and the base of the first bipolar transistor and the base of the second bipolar transistor.

20. The power amplification module according to claim 19, further comprising:
a first capacitor, wherein the radio frequency signal is input to the base of the first bipolar transistor and the base of the second bipolar transistor via the first capacitor.

* * * * *